United States Patent
Pourchet et al.

(10) Patent No.: US 10,984,708 B1
(45) Date of Patent: Apr. 20, 2021

(54) MANUFACTURE LED DISPLAYS USING TEMPORARY CARRIERS

(71) Applicant: Facebook Technologies, LLC, Menlo Park, CA (US)

(72) Inventors: Allan Pourchet, Cork (IE); Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/372,324

(22) Filed: Apr. 1, 2019

Related U.S. Application Data (60) Provisional application No. 62/650,868, filed on Mar. 30, 2018.

(51) Int. Cl.
| | |
|---|---|
| G09G 3/3225 | (2016.01) |
| H01L 33/62 | (2010.01) |
| H01L 33/18 | (2010.01) |
| G06F 9/30 | (2018.01) |
| H05B 45/20 | (2020.01) |
| H05B 45/50 | (2020.01) |

(52) U.S. Cl.
CPC ......... *G09G 3/3225* (2013.01); *G06F 9/3004* (2013.01); *H01L 33/18* (2013.01); *H01L 33/62* (2013.01); *H05B 45/20* (2020.01); *H05B 45/50* (2020.01)

(58) Field of Classification Search
CPC ........... H01L 21/67144; H01L 25/0655; H01L 2933/0066; H01L 33/08; H01L 33/24; H01L 33/0079
See application file for complete search history.

(56) References Cited

U.S. PATENT DOCUMENTS

| | | | | |
|---|---|---|---|---|
| 6,969,624 | B2 * | 11/2005 | Iwafuchi | H01L 33/0093 438/22 |
| 2014/0239348 | A1 * | 8/2014 | Schubert | H01L 29/778 257/194 |
| 2015/0008389 | A1 * | 1/2015 | Hu | H01L 33/005 257/13 |
| 2016/0093600 | A1 * | 3/2016 | Bower | H01L 24/82 257/89 |
| 2017/0141155 | A1 * | 5/2017 | Hughes | H01L 33/486 |
| 2017/0250167 | A1 * | 8/2017 | Bower | H01L 25/167 |
| 2018/0138071 | A1 * | 5/2018 | Bower | H01L 33/0095 |
| 2018/0166429 | A1 * | 6/2018 | Chong | H01L 25/167 |
| 2019/0097081 | A1 * | 3/2019 | Liao | H01L 25/0753 |
| 2019/0237347 | A1 * | 8/2019 | Saketi | H01J 37/321 |
| 2019/0296202 | A1 * | 9/2019 | Chen | H01L 24/83 |
| 2020/0035882 | A1 * | 1/2020 | Brodoceanu | H01L 33/0093 |
| 2020/0111939 | A1 * | 4/2020 | Brodoceanu | H01L 21/67144 |

* cited by examiner

*Primary Examiner* — Priyank J Shah
(74) *Attorney, Agent, or Firm* — Fenwick & West LLP (57) ABSTRACT

To manufacture a display using light emitting diodes (LEDs), the LEDs are transferred from fabrication substrates where they are fabricated to a target substrate (e.g., a backplane) that forms part of a display. The LEDs are transferred in three stages: first from fabrication substrates to hard handles, subsequently from the hard handles to a carrier substrate, and last from the carrier substrate to the target substrate. The LEDs are placed onto the carrier substrate to form pixel arrangements. One or more pick-up tools are used to transfer the LEDs. Switchable adhesives are used to facilitate the transfer of the LEDs from the fabrication substrates to the target substrate.

17 Claims, 7 Drawing Sheets

MANUFACTURE LED DISPLAYS USING TEMPORARY CARRIERS

CROSS REFERENCE TO RELATED APPLICATIONS

This application claims the benefit of U.S. Provisional Application No. 62/650,868, filed Mar. 30, 2018, which is incorporated by reference in its entirety.

BACKGROUND

The present disclosure relates to an assembly process for use in, but not exclusively limited to, pick and place of very small display element(s) that need to be transferred from a native substrate to a target substrate using temporary carriers.

To manufacture a display with very small light emitting diodes (LEDs), such as micro-LEDs, the LEDs need to be transferred from the native substrate on which they have been manufactured to the display substrate that forms part of a display. On the display substrate, the LEDs are assembled such that they are separated by a defined separation distance or they are closely packed together on the target substrate. Conventional pick and place techniques are unsuitable due to the small size of these devices (e.g., smaller than 49×40 $\mu m^2$).

SUMMARY

Embodiments relate to manufacturing a display using light emitting diodes (LEDs) such as micro-LEDs (hereinafter referred to as μLEDs) by using temporary carriers. To manufacture such a display, the LEDs are transferred from fabrication substrates where they are fabricated to a target substrate (e.g., a backplane) that forms part of a display. The LEDs are transferred in three stages: first from fabrication substrates to hard handles, subsequently from the hard handles to a carrier substrate, and from the carrier substrate to the target substrate.

In one or more embodiments, switchable adhesives are used to facilitate the transfer of the LEDs from the fabrication substrates to the target substrate. A first switchable adhesive in an adhesive state may be used to fix LEDs in place on a hard handle when separating a fabrication substrate from the LEDs. Laser lift off (LLO) is used to separate the LEDs from the fabrication substrate. Subsequently, the first switchable adhesive is switched to a non-adhesive state to release the LEDs. The LEDs can be picked up and placed onto a carrier substrate.

In one or more embodiment, a second switchable adhesive in an adhesive state is used to fix LEDs that have been placed on the carrier substrate. To transfer the LEDs from the carrier substrate onto the target substrate, the second switchable adhesive is switched to the non-adhesive.

BRIEF DESCRIPTION OF THE DRAWINGS

The figures depict embodiments of the present disclosure for purposes of illustration only.

DETAILED DESCRIPTION

Example Display Fabrication System

Figure 1:
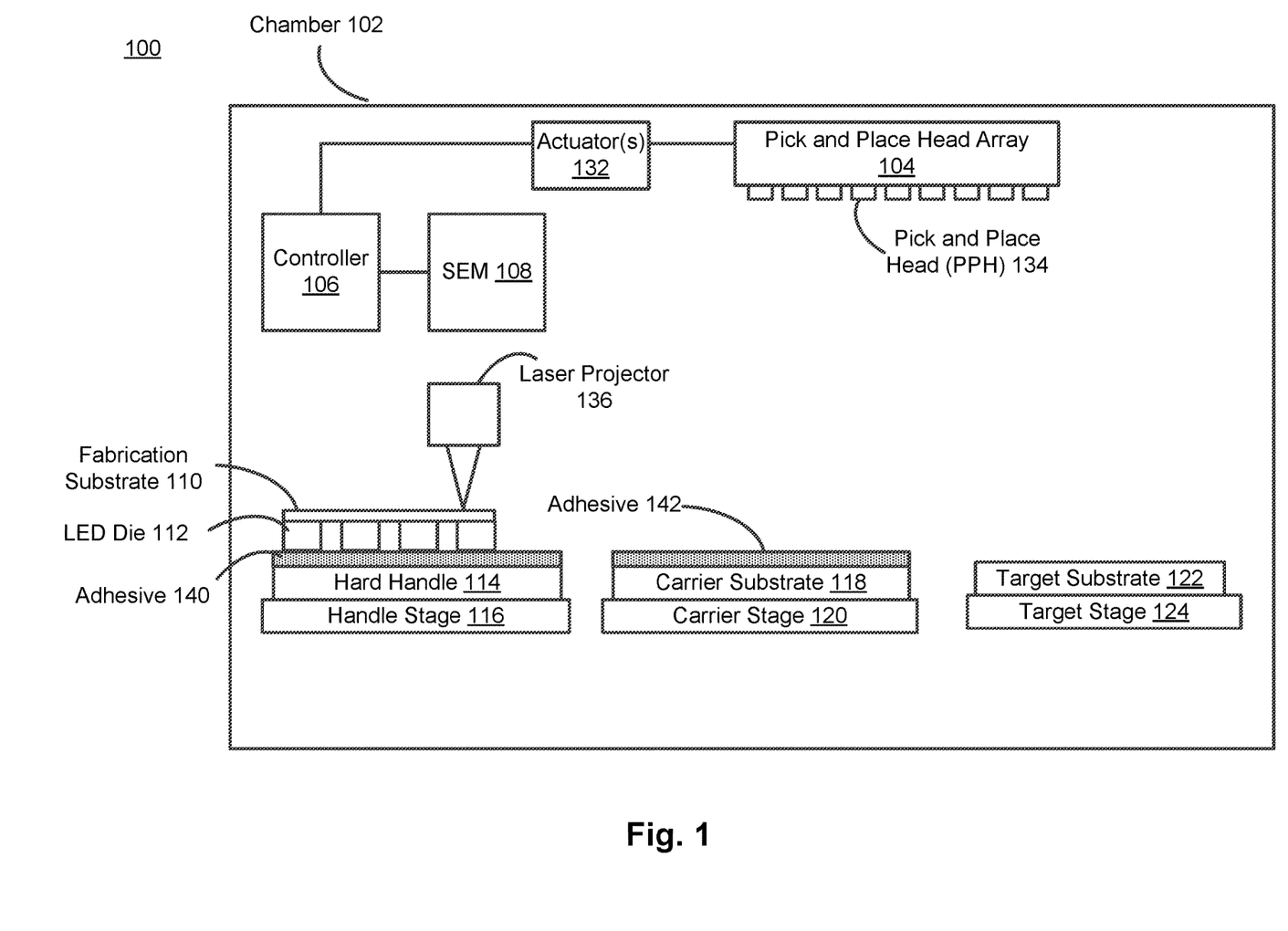
FIG. 1 is schematic diagram illustrating a display fabrication system, according to one embodiment.

FIG. 1 is a block diagram illustrating a display fabrication system 100, in accordance one embodiment. The system 100 fabricates a display device by assembling LED dies 112 from a fabrication substrate 110 to a target substrate 122. The LED dies 112 can be μLED dies. A μLED die is a discrete light emitting element that produces light of a particular wavelength profile. A μLED die is also referred to as a μLED and a LED die is also referred to as a LED. A μLED as described herein refers to a particular type of LED having a small active light emitting area (e.g., less than 2,000 $\mu m^2$), and collimated light output. The collimated light output increases the brightness level of light emitted from the small active light emitting area and prevents the spreading of emitted light into the beampath of invisible light used by light detectors and non-visible LEDs adjacent to the μLED. Compared to conventional LEDs, μLEDs have a reduced divergence of light output and small light emitting area. While the application discusses primarily μLEDs, other semiconductor devices can be assembled using the system and process described herein.

The system 100 includes a chamber 102 for defining an interior environment for picking and placing LEDs 112 within the chamber 102. The system 100 includes a pick and place head (PPH) array 104, a scanning electron microscope (SEM) 108, an actuator 132, a handle stage 116, a hard handle 114, a carrier stage 120, a carrier substrate 118, a target stage 124, and a target substrate 122, and a laser projector 136, all of which are housed by the chamber 102. The system 100 may also include other components such as a probing device or a mechanical dicer that are housed within the chamber 102 such as a probing device.

Figure 2:
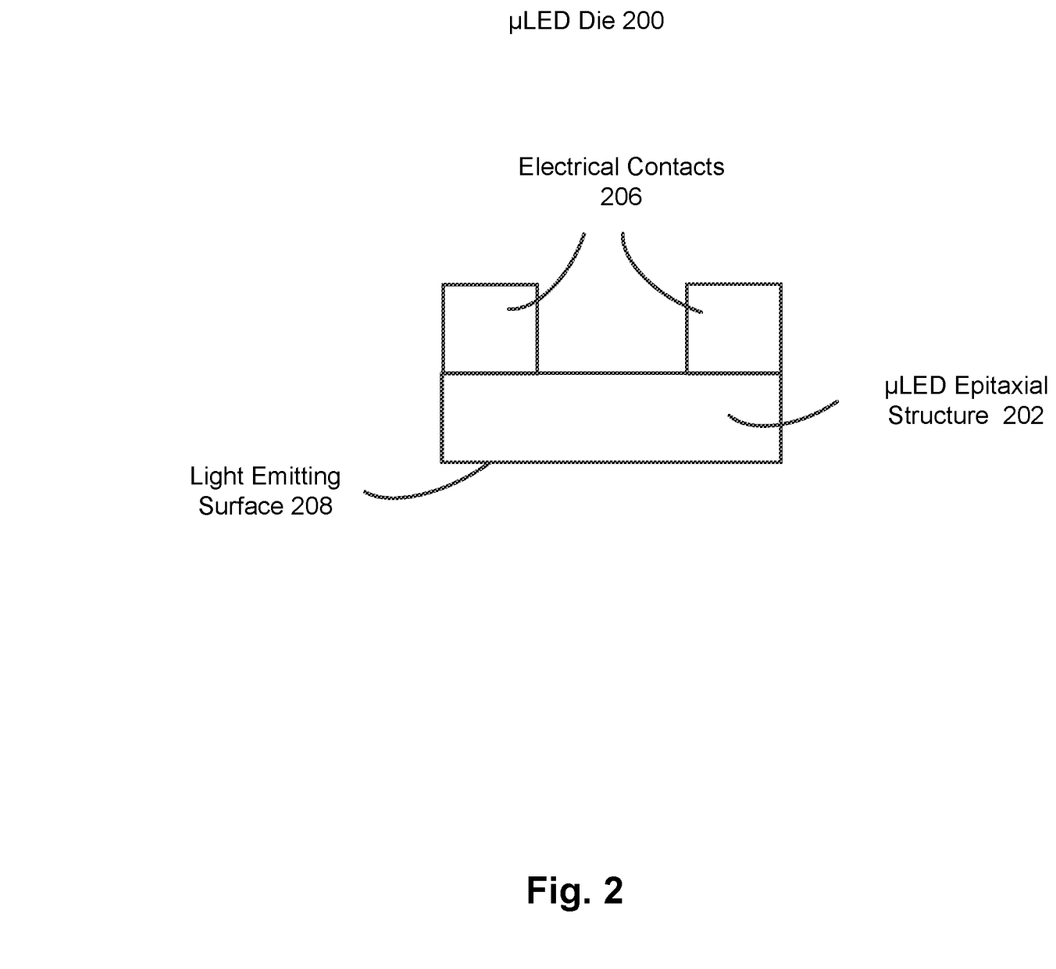
FIG. 2 illustrates a schematic diagram of the μLED, according to one embodiment.

The fabrication substrate 110 is a layer of material (e.g., glass, sapphire, or semiconductor materials such as Gallium Arsenide (GaAs), Gallium phosphide (GaP), or silicon) where the LEDs 112 are fabricated. A semiconductor layer (e.g., a gallium semiconductor layer) may be grown onto the fabrication substrate 110 for forming the LEDs 112. In various embodiments described herein, a μLED is based on an epitaxial structure as further described with respect to FIG. 2A.

The hard handle 114 is a temporary substrate for transferring LEDs 112 from the fabrication substrate 110 to a carrier substrate 118. As described below with reference to FIGS. 3B and 3C, the fabrication substrate 110 is removed after the LEDs 112 are attached to the hard handle 114 via switchable adhesive 140. After the fabrication substrate 110 is removed, the hard handle 114 holds the LEDs 112 for pick up by the PPH array 104. The switchable adhesive 140 can be switched from an adhesive state to a non-adhesive state based on operation conditions such as exposure to thermal heating, UV (ultra-violet) light and etching, solvent. In the adhesive state, the switchable adhesive 140 fixes the LEDs 112 in place with an adhesion force. For example, when separating the LEDs 112 from the fabrication substrate 110, the switchable adhesive 140 is in the adhesive state and fixes the LEDs 112 in place with an adhesion force. The switchable adhesive 140 are placed in the non-adhesive state when the LEDs 112 are to be picked up by the PPH array 104 for transfer to the carrier substrate 118.

The handle stage 116 supports the hard handle 114. In one embodiment, the position of the handle stage 116 can be adjusted with three degrees of freedom including left and right, backward and forward, and a yaw rotational degree of freedom. Because the hard handle 114 is moved with the handle stage 116, moving the handle stage 116 facilitates the hard handle 114 to be precisely aligned to the PPH array 104.

The carrier substrate 118 is a substrate that holds the LEDs 112 for pick up and transfer of the LEDs 112 to the target substrate 122. The carrier substrate 118 holds singulated LEDs 112 fabricated from multiple fabrication substrates 110 for transfer to the target substrate 122. For example, the carrier substrate 118 may simultaneously hold red LEDs, green LEDs and blue LEDs. The LEDs 112 are placed on the carrier substrate 118 according to their final relative positions on a display (e.g., on the target substrate 122). In some embodiments, on the carrier substrate 118, the LEDs 112 are positioned to form pixel arrangements. A pixel arrangement includes three µLEDs, each emitting red, blue, and green light, respectively, that are positioned according to their positions in a pixel assembly on a display.

The carrier substrate 118 includes a switchable adhesive 142. Similar to the switchable adhesive 140, the switchable adhesive 142 can also be switched between an adhesive state and a non-adhesive state. The switchable adhesive 142 in the adhesive state is used to fix the LEDs 112 onto the carrier substrate 118 with its adhesion force. Because the LEDs 112 are not positioned onto the carrier substrate 118 all at once, the switchable adhesive 142 holds the LEDs 112 that have already been placed onto the carrier substrate 118 while additional LEDs 112 are being placed onto the carrier substrate 118.

In some embodiments, LEDs 112 are tested for their operating while mounted on the carrier substrate 118. For example, a probing device drives the LEDs 112 to emit light to identify defective devices (e.g., not emitting light when being turned on, or emitting light when turned off). The carrier substrate 118 may also include testing circuits (not shown) for testing the LEDs 112. For example, the carrier substrate 118 includes circuits that supply an electrical current to turn the LEDs 112 on and off. In such cases where testing is performed while LEDs 112 are on the carrier substrate 118, the switchable adhesive 142 fixes the LEDs 112 on the carrier substrate 118 place during testing. After testing, the switchable adhesive 140 is placed in the non-adhesive state to release the LEDs 112 when the LEDs 112 are ready to be picked up by the PPH array 104. LEDs that are identified to be defective during the testing are not transferred from the carrier substrate 118 to the target substrate 122.

The switchable adhesive 142 can be the same material as the switchable adhesive 140 or can be of different material. Similar to the switchable adhesive 140, the switchable adhesive 142 can be switched between the adhesive state and the non-adhesive state by various conditions such as exposure to thermal heating, UV (ultra-violet) light, etching, and solvent. In one or more embodiments, the switchable adhesives 140, 142 may have different adhesiveness. The adhesiveness of the switchable adhesive 142 is stronger than the adhesiveness of the switchable adhesive 140 because the force involved in removing the fabrication substrate 110 may be stronger than the force involved in transferring LEDs 112 from the hard handle 114 to the carrier substrate 118.

The carrier stage 120 supports the carrier substrate 118. Similar to the handle stage 116, the position of the carrier stage 120 can also be adjusted with three degrees of freedom. Because the carrier substrate 118 is moved with the carrier stage 120, moving the carrier stage 120 facilitates the carrier substrate 118 to be precisely aligned to the PPH array 104.

The target substrate 122 is a display substrate onto which the LEDs 112 are finally placed. The system 100 places LEDs 112 at predetermined locations on the target substrate 122. For example, three LEDs that form a pixel arrangement on the carrier substrate 118 are picked up and placed onto the target substrate 122 at corresponding locations on the target substrate 122 to form a pixel assembly. The electrodes of LEDs 112 are attached to traces or electrodes of the display substrate, for example, using thermocompression (TC) bonding, after LEDs for all pixel assemblies are placed on the target substrate 122.

The target stage 124 supports the target substrate 122. Similar to the handle stage 116 and the carrier stage 120, the position of the target stage 124 can also be adjusted with three degrees of freedom. Because the target substrate 122 is moved with the target stage 124, moving the target stage 124 facilitates the target substrate 122 to be precisely aligned to the PPH array 104. In some embodiments, the target stage 124 includes a heater for TC bonding of the electrical contact pads of the LEDs 112 to the electrodes or traces of the target substrate 122.

A pick-up tool (PUT) transfers the LEDs 112 from the hard handle 114 to the carrier substrate 118, and from the carrier substrate 118 to the target substrate 122. In one embodiment, one PUT is used for transferring LEDs from the hard handle 114 to the carrier substrate 118, and another PUT is used for transferring LEDs from the carrier substrate 118 to the target substrate 122. The PUT may include, among other components, the controller 106, the SEM 108, the actuator(s) 132, and the PPH array 104.

The PPH array 104 is configured to be attached to the LEDs 112 to attach the LEDs 112 and then release the LEDs 112. The PPH array 104 includes a plurality of PPHs 134 each of which is configured to be attached to a LED 112.

Positions of the PPH array 104 can be adjusted. A position of the PPH array 104 can be adjusted to be aligned to a location for picking up LEDs 112 or for placing LEDs 112. The movement of the PPH array 104 is controlled by the actuators 132.

The actuator 132 is an electro-mechanical component that controls the movement of the PPH array 104. For example, the actuator 132 moves the PPH array 104, or individual PPHs 134, with three degrees of freedom including up and down, left and right, and forward and back. The actuator 132 may be embodied, for example, as a rotating motor, a linear motor or a hydraulic cylinder. The actuator 132 operates according to instructions from the controller 106.

A controller 106 generates instructions to control operations of the actuator 132 thereby to control the movement the PPH array 104. For example, the controller 106 generates instructions for the actuator 132 to align the PPH array 104 to the hard handle 114 thereby to pick up LEDs 112, to align the PPH array 104 to the carrier substrate 118 to pick up or to place the LEDs 112, to align the PPH array 104 to the target substrate 122 to place the LEDs 112. The controller 106 generates instructions according to images generated by the SEM 108. For example, based on the images of the PPH array 104 and the hard handle 114 (the carrier substrate 118, or the target substrate 122), the controller 106 generates instructions to cause the actuator 132 to move the PPH array 104 to be aligned to the hard handle 114 (the carrier substrate 118, or the target substrate 122). In addition, the controller 106 controls operations of the SEM 108. The controller 106 controls the SEM 108 to capture images and to provide the captured images to the controller 106. As illustrated, the controller 106 is coupled to the PPH array 104 (e.g., via the actuator 132) and to the SEM 108. The controller 106 may include a non-transient computer readable storage medium (e.g., DRAM) for storing instructions of PUT components and a processor for executing these instructions.

The SEM 108 facilitates aligning the PPH array 104 to a location. The SEM 108 captures images of the PPH array 104 and a location (e.g., a hard handle 114, a carrier substrate 118, and a target substrate 122) and provides the images to the controller 106 according to the instructions received from the controller 106. In some embodiments, the SEM 108 is an environmental scanning electron microscope (ESEM) to capture images without specimen coating. The chamber 102 is an ESEM chamber including a high pressure atmosphere of water vapor. The use of an SEM is advantageous for picking up and placing small semiconductor devices, such as μLED dies. Other types of imaging devices may be used to facilitate the alignment.

In some embodiments, the system 100 includes multiple PPH arrays 104 positioned at separate stations where each station is dedicated for picking and placing LEDs emitting a particular colored light. For example, three separate stations are used for picking and placing LEDs emitting green, red, and blue light, respectively. Each station may be dedicated for picking LEDs from the fabrication substrate and placing the LEDs on the carrier substrate to form pixel arrangements. For example, a station is used for picking and placing LEDs emitting green, red, and blue light from the carrier substrate 118 to the target substrate 122.

In the illustrated example, one controller 106 is coupled to one PPH array 104 and controls the operation of the PPH array 104. The controller 106 can be coupled to multiple PPH array 104 and controls their operations.

The laser projector 136 projects a laser to perform laser liftoff (LLO) for detaching the fabrication substrate 110 from the LEDs 112. In some embodiments, the laser passes through the fabrication substrate 110 and reach the LEDs 112, in particular, the semiconductor layer of the LEDs 112. The semiconductor layer absorbs the laser beam. The absorption weakens the bond between the semiconductor layer and the fabrication substrate 110 thereby separating the LEDs 112 from the fabrication substrate 110. The laser projected by the laser projector 136 is of a wavelength selected according to the material of the fabrication substrate 110. For example, for fabrication substrates 110 made of sapphire, the laser projector 136 projects a pulse ultraviolet laser. For fabrication substrates 110 made of GaAs, the laser projector 136 projects an infrared (IR) laser. In other embodiments, the laser projector 136 projects the laser at the junction of the fabrication substrate 110 and the gallium semiconductor layer of the LEDs 112. In these cases, the projected laser does not pass through the fabrication substrate 110 because the fabrication substrate 110 is made of a material not substantially transparent to the laser projected by the laser projector 136.

In some embodiments, another laser (not shown) generates a laser beam to singulate the LEDs 112. In some embodiments, the laser beam is directed through the hard handle 114. In some embodiments, the system 100 includes a mechanical dicer to singulate the LEDs 112, such as a diamond based cutting wheel.

μLED Structure

FIG. 2 is a cross sectional view of a schematic diagram of a μLED die 200, in accordance with one embodiment. The μLED die 200 may include, among others, a μLED epitaxial structure 202, and electrical contacts 206. The μLED epitaxial structure 202 may correspond to the μLED epitaxial structure 200 illustrated in FIG. 2A. The electrical contacts 206 serve as interconnects for the LED die 200 when the LED die 200 is mounted to a display substrate.

The electrical contacts 206 are provided in the form of bumps or microbumps, for interconnection of the μLED die 200 to an electrical conductor. The electrical contacts are arranged on the top surface of the μLED die 200 and are on top of the p- and n-contacts of the LED epitaxial structure 202, which are arranged on a single side of the μLED epitaxial structure 202 opposite to the light emission surface 208. The electrical contacts 206 are made of a metal (e.g., CuSn or Cu) to interconnect to metal pads (e.g., Cu pads) on electrical conductors on a display substrate.

Example Manufacture Process

Figure 3A:
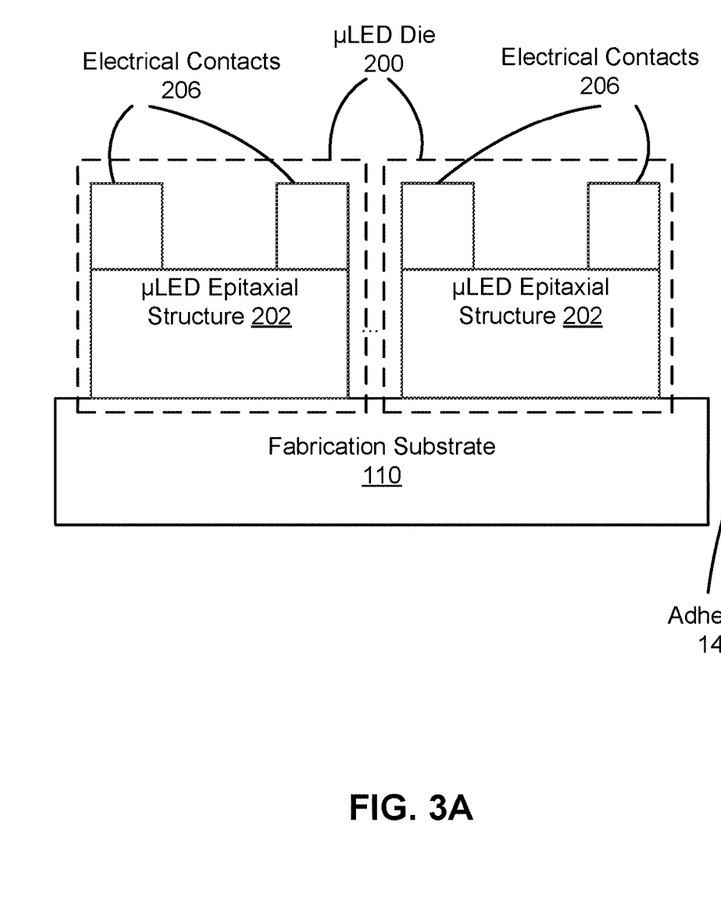
FIGS. 3A-3F are diagrams illustrating different stages of a process of manufacturing a display device, according to one embodiment.

FIGS. 3A-3F are diagrams illustrating different stages of a process of manufacturing a display device, according to one embodiment. FIG. 3A illustrates an array of μLED dies 200 fabricated on a fabrication substrate 110. The μLED die 300 includes a μLED epitaxial structure 202 and a pair of electrical contacts 206. Detailed description of the fabrication substrate 110, the μLED dies 200, μLED epitaxial structure 202, and electrical contacts 206 can be found in the above description in connection with FIGS. 1 through 2 and is omitted herein.

Figure 3B:
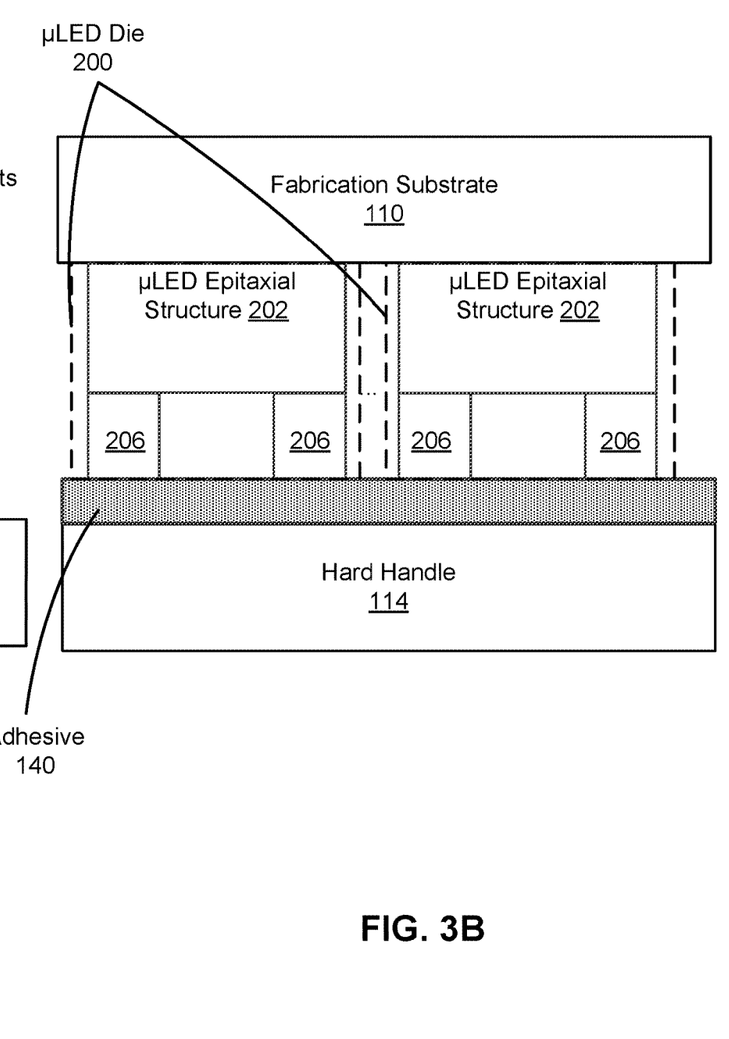

FIG. 3B illustrates the array of μLED s 200 flipped over relative to what is shown in FIG. 3A, and positioned on the hard handle 114, according to one embodiment. The hard handle 114 includes a switchable adhesive 140. Description of the hard handle 114 and the switchable adhesive 140 can be found in the above description in connection with FIG. 1 and is omitted herein. The fabrication substrate 110 is positioned on the hard handle 114 such that the electrical contacts 206 of the array of μLED dies 200 contact the switchable adhesive 140. The surface of the fabrication substrate 110 opposite the surface where the μLED dies 200 are fabricated is exposed.

Figure 3C:
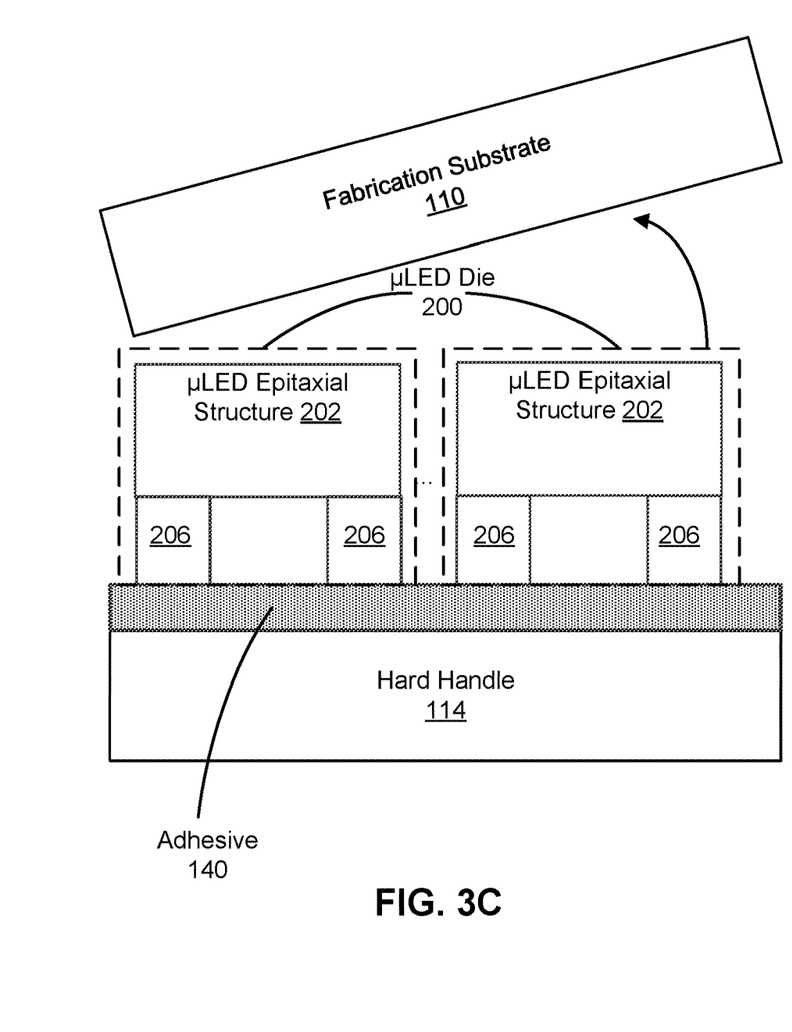
Figure 3D:
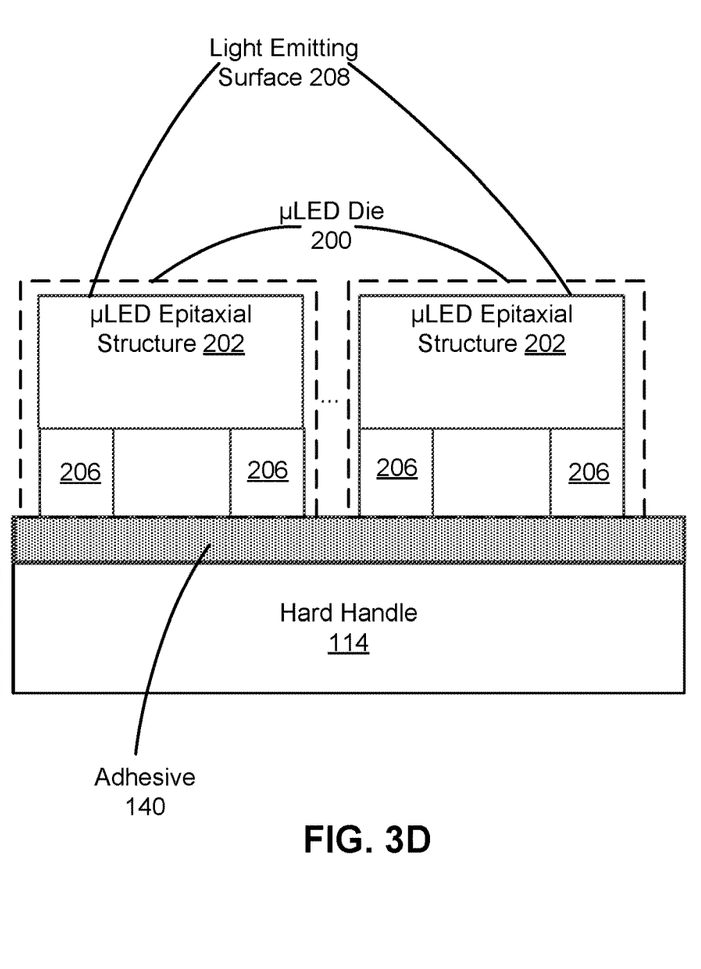

FIGS. 3C-3D are described together. FIG. 3C illustrates removing the fabrication substrate 110. The fabrication substrate 110 is removed, for example, by applying a LLO process. During the process of removing the fabrication substrate 110, the switchable adhesive 140 is adjusted in the adhesive state to fix the μLED dies 200 in place thereby to prevent the μLED dies 200 from being damaged. After the fabrication substrate 110 is removed, a light emitting surface 208 of the μLED die 300 is exposed, as shown in FIG. 3D.

In some embodiments, the μLED dies 200 are singulated after the fabrication substrate 110 is removed. In some embodiments, an elastomer layer (not shown) is deposited or formed on the light emitting surface 208. The elastomer layer facilitates the attachment of a μLED die 200 to a PPH.

When the μLED dies 200 are ready to be transferred to a carrier substrate, the switchable adhesive 140 is switched to the non-adhesive state thereby to release the μLED dies 200 for pick up by a PPH array. The switchable adhesive 140 is switched to a non-adhesive state after the fabrication substrate 110 is removed.

The above-described process of placing μLED dies 200 and a fabrication substrate 110 on a hard handle, and removing the fabrication substrate 110 are repeated for exposing μLED dies that emit different colored light. This is because μLED dies that are fabricated on the same fabrication substrate 110 emit the same colored light, and a pixel assembly on a display includes at least three μLED dies that emit red, green, and blue light.

Figure 3E:
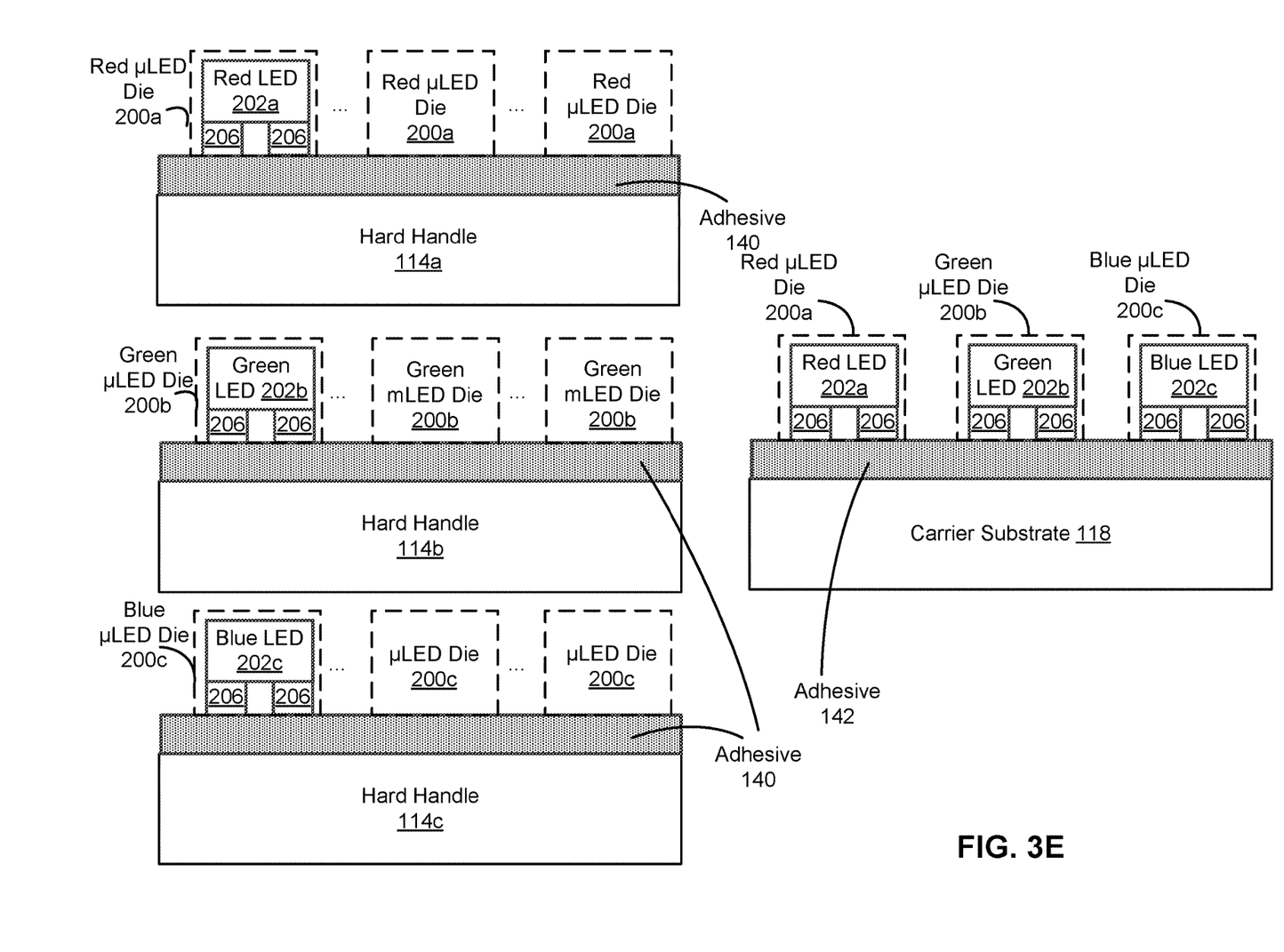

FIG. 3E illustrates transferring μLED dies from different hard handles 114 onto a carrier substrate 118, according to one embodiment. As illustrated, the hard handle 114a supports an array of μLED dies 200a that emit red light, the hard handle 114b supports an array of μLED dies 200b that emit green light, and the hard handle 114c supports an array of μLED dies 200c that emit blue light. A letter after a reference numeral, such as "200a," indicates that the text refers specifically to the element having that particular reference numeral, while a reference numeral in the text without a letter, such as "200," refers to any or all of the elements in the figures bearing that reference numeral. The switchable adhesives 140 of the hard handles 114a, 114b, 114c are all switched to a non-adhesive state to release the μLED dies 200a, 200b, 200c for picking up by one or more PPH arrays. A PPH array (not shown) picks up one or more μLED dies 200a from the hard handle 114a and place them on the carrier substrate 118. Similarly, the μLED dies 200b (200c) are transferred from the hard handle 114b (114c) to the carrier substrate 118. The same PPH array or different PPH arrays can be used to transfer μLED dies that emit different colored light.

The μLED dies 200a, 200b, 200c are placed onto predetermined locations on the carrier substrate 118 to form pixel arrangements. That is, the positions of the μLED dies 200a, 200b, 200c relative to each other on the carrier substrate 118 are the same as those of theirs on a display substrate. Description of the carrier substrate 118 and the switchable adhesive 140 can be found in the above description in connection with FIG. 1 and is omitted. The switchable adhesive 142 is switched to the adhesive state to hold the pixel dies that have been placed onto the carrier substrate 118 in place while additional pixel dies are being placed onto the carrier substrate 118.

The electrical contacts 206 may be in temporary metal to metal contact with testing circuits on the carrier substrate 118. The temporary metal to metal contact between the electrical contacts 206 and the corresponding testing circuits (e.g., metal pads on the testing circuits) allow testing of the μLED dies 200a, 200b, 200c in a temporary bond state without permanent bonds. Defective μLED dies can be identified by the testing.

The switchable adhesive 142 is switched to the non-adhesive state to release the μLED dies 200a, 200b, 200c when they are ready to be transferred from the carrier substrate 118 to a target substrate.

Figure 3F:
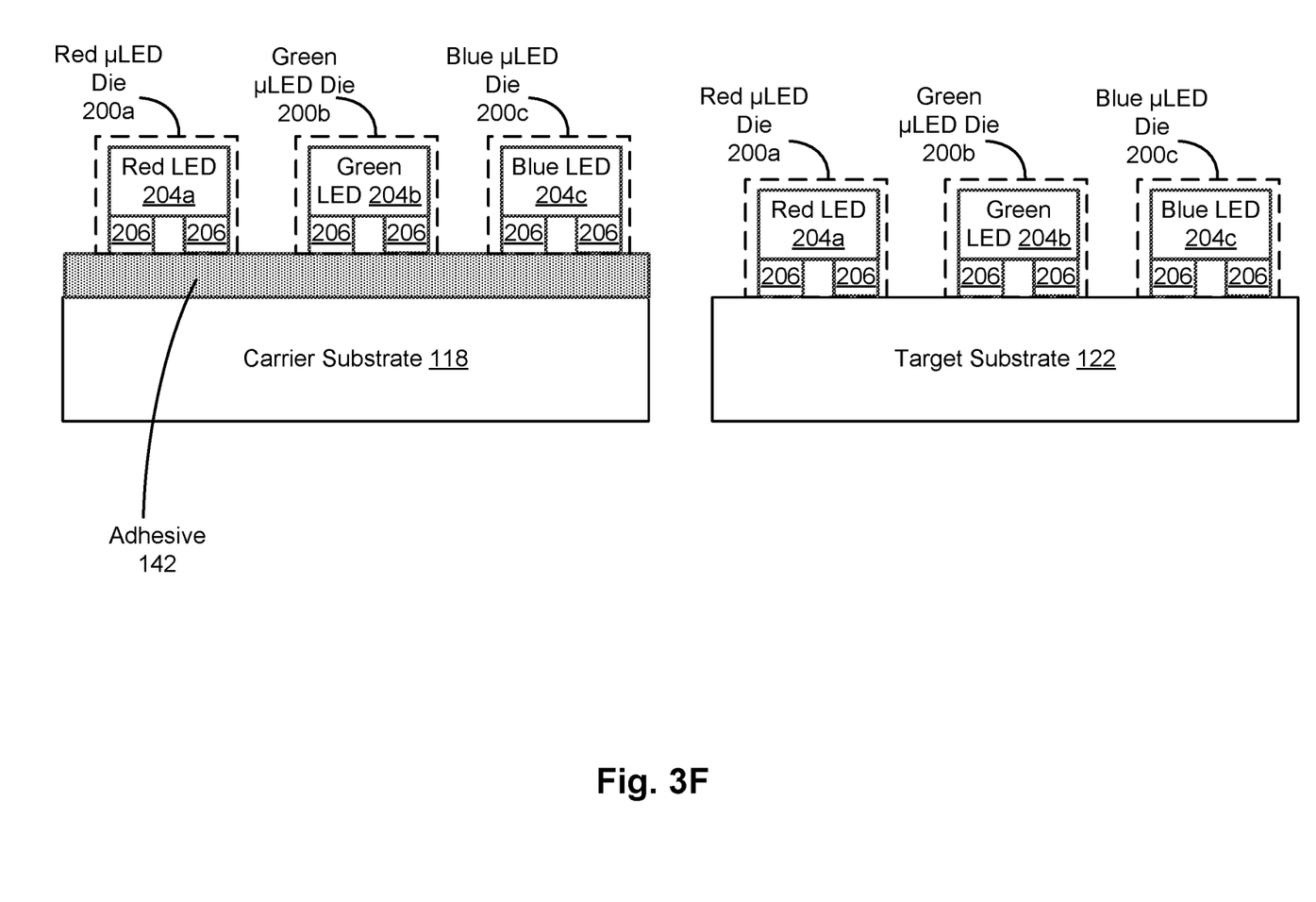

FIG. 3F illustrates transferring μLED dies from the carrier substrate 118 to a target substrate 122. A PPH array picks up μLEDs forming one or more pixel arrangements from the carrier substrate 118 and places them on the target substrate 122. μLED dies that form a pixel arrangement may be transferred concurrently. Multiple pixel arrangements can be transferred concurrently. In some embodiments, defective μLED dies are not transferred and left on the carrier substrate.

The μLED dies 200 are placed into predetermined locations on the target substrate 122. The electrical contacts 206 contact electrical conductors (e.g., a TFT (thin-film transistor) layer) or corresponding contact pads on the electrical conductors included in the target substrate 122.

A bonding head such as a TC bonding head contacts the μLED dies 200 and applies a thermal compression force to create a permanent bond between the μLED dies 200 and the target substrate 122. The TC force creates reflow of the electrical contacts of the μLED dies or metallic interdiffusion, e.g., Solid Liquid interdiffusion (SLID). SLID involves an excitation source, such as a thermal, compression or ultrasonic forces to create a permanent bond. For example, a TC bonding head in the form of a drum may be used to provide a compressive force and a thermal transfer configured to activate the electrical contacts of the LED dies. The drum may be rolled across the one or more LED dies to bond them to the target substrate 122. Because the permanent bonds are created concurrently, there is no reflow of bonding materials of existing bonds when new bonds are created, which improves the bonding quality compared to creating bonds sequentially.

Figure 4:
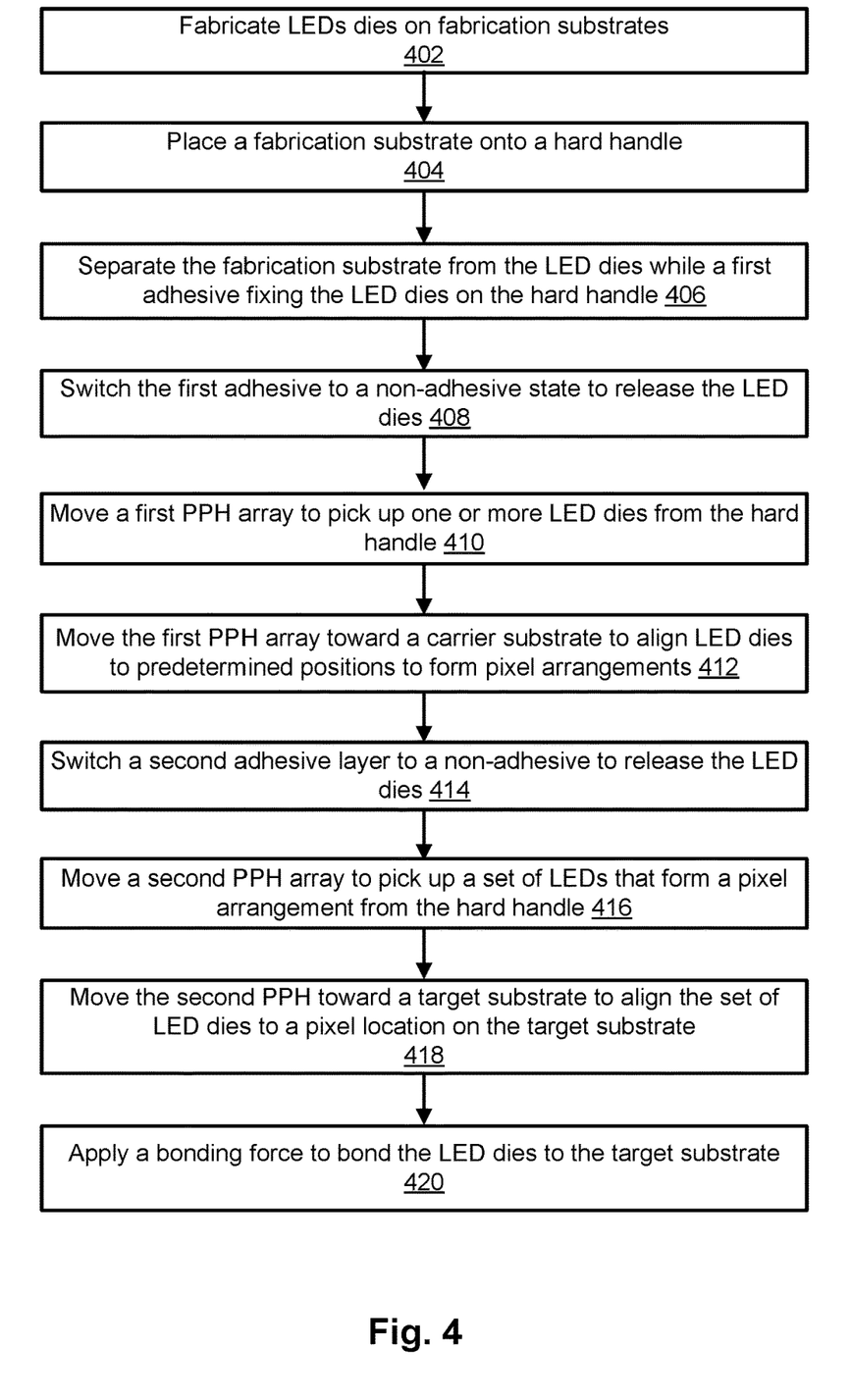
FIG. 4 is a flowchart illustrating a process of manufacturing a display device, in according to one embodiment.

FIG. 4 is a flow diagram illustrating a process of manufacturing a display device, according to one embodiment. A system fabricates 402 LED dies on fabrication substrates. On a particular fabrication substrate, an array of LED dies that emit a particular colored light is fabricated. The LED dies may correspond to the μLED dies 200 illustrated in FIG. 2B.

The system 100 places 404 a fabrication substrate including an array of LED dies fabricated on the fabrication substrate onto a hard handle (e.g., the hard handle 114). The fabrication substrate is positioned on the hard handle such that an exterior surface is exposed. The exterior surface is opposite the surface onto which the LED dies are fabricated. In some embodiments, electrical contact pads of the LED dies contact the hard handle.

On a particular hard handle, the system 100 separates 406 the fabrication substrate from the array of LED dies while a first adhesive of the hard handle fixing the array of LED dies on the hard handle. In various embodiments, LLO is used to remove the fabrication substrate from the LED dies. In some embodiments, a laser projector (e.g., the laser projector 136) projects a laser that can pass through the fabrication substrate. In some embodiments, the laser projector projects a laser at the junction of the fabrication substrate and a semiconductor layer of the LED dies.

The system 100 switches 408 the first adhesive to a non-adhesive state to release the LED dies for transfer to a carrier substrate. The first adhesive is a switchable adhesive. For example, the system 100 exposes the first adhesive to thermal heating, UV (ultra-violet) light, etching, a solvent, and the like to switch the first adhesive to the non-adhesive state.

The system 100 may place multiple fabrication substrates onto which LED dies that emit different colored light onto corresponding hard handles. Concurrently, the system 100 removes fabrication substrates from LED dies and singulating the LED dies supported by different hard handles.

The system 100 moves 410 a first PPH array (e.g., the PPH head array 104) to pick up one or more LED dies from the hard handle. The system 100 moves the first PPH array to align a PPH 134 to a LED die.

The system 100 moves 412 the first PPH array toward a carrier substrate to align the one or more LED dies to predetermined positions to form pixel arrangements. The predetermined positions are determined corresponding to relative positions of multiple LED dies that form a pixel assembly. The carrier substrate may include testing circuits for testing the LED dies. The first PPH array is moved to align electrical contact pads of the one or more LED dies to corresponding electrical contact pads on the testing circuits. The system 100 may test LED dies on the carrier substrate after pixel arrangements are formed. Defective LED dies are identified. In some embodiments, the defective LED dies are not transferred to the target substrate.

The system 100 transfers LEDs to the carrier substrate to form pixel arrangement while the second adhesive fixes LEDs that have already been placed onto the carrier substrate in place. The system 100 may transfer LEDs that emit different colored light from different hard handles to the carrier substrate concurrently.

The system 100 switches 414 the second adhesive to a non-adhesive state to release the LED dies for transfer to a target substrate. The second adhesive is a switchable adhesive. For example, the system 100 exposes the second adhesive to thermal heating, UV (ultra-violet) light, etching, a solvent, and the like to switch the second adhesive to the non-adhesive state.

The system 100 moves 416 a second PPH array (e.g., the PPH head array 104) to pick up a set of LED dies that form a pixel arrangement from the carrier substrate. The system 100 may move the PPH array to align a PPH to a LED die in a pixel arrangement or to align a PPH to a pixel arrangement. The system 100 may configure the second PPH array not to pick up any defective LED dies.

The system 100 moves 418 the second PPH array toward the target substrate (e.g., the target substrate 122) to align the set of LEDs to a pixel location on the target substrate. The target substrate includes electrical circuits for controlling the LEDs that form pixel assemblies. The second PPH array is moved to align electrical contact pads of the set of LED dies to corresponding electrical contact pads on the electrical circuits. The system 100 may transfer LED dies that form multiple pixel arrangements concurrently from the carrier substrate to the target substrate.

The system 100 applies a bonding force to bond the LED dies to the target substrate. For example, a bonding head such as a TC bonding head contacts the μLED dies and applies a thermal compression force to create a permanent bond between the electrical contact pads of the μLED dies and the electrical contact pads of the electrical circuits of the target substrate.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of manufacturing a display including light emitting diodes (LEDs), comprising:
   transferring first LED dies from a first fabrication substrate onto a first hard handle comprising a first adhesive, each of the first LED dies configured to emit a first colored light, the first LED dies secured onto the first hard handle by the first adhesive;
   transferring one or more of the first LED dies from the first hard handle to a carrier substrate comprising a second adhesive using a pick and place head (PPH) array with electrical contacts of the one or more of the first LED dies extending in one direction away from epitaxial structures of the first LED dies and facing the carrier substrate to form pixel arrangements on the carrier substrate, each of the pixel arrangements comprising a plurality of LED dies including one of the first LED dies; and
   transferring one or more pixel arrangements from the carrier substrate to corresponding pixel locations on a display substrate,
   wherein an adhesive force applied onto a first LED die by the first adhesive in an adhesive state is stronger than an adhesive force applied onto the first LED die by the second adhesive in an adhesive state.

2. The method of claim 1, further comprising:
   switching the first adhesive to a non-adhesive state from an adhesive state to release the first LED dies for picking up by the PPH array before transferring the one or more first LED dies from the first hard handle to the carrier substrate.

3. The method of claim 1, further comprising:
   switching the second adhesive to a non-adhesive state from the adhesive state to release the pixel arrangements before transferring the first LED dies from the carrier substrate to the display substrate.

4. The method of claim 1, wherein the carrier substrate comprises a testing circuit configured to perform testing of the one or more first LED dies on the carrier substrate.

5. The method of claim 4, further comprising:
   performing testing on the one or more first LEDs on the carrier substrate using the testing circuit to detect defective LEDs; and
   leaving the detected defective LED dies on the carrier substrate.

6. The method of claim 1, further comprising:
   transferring one or more second LED dies configured to emit a second colored light from a second hard handle to the carrier substrate, wherein the one or more second LED dies in conjunction with the one or more first LED dies form the pixel arrangements on the carrier substrate.

7. The method of claim 6, wherein relative positions of the first LED dies and the second LED dies on the carrier substrate are same as relative positions of the first LED dies and the second LED dies on the display substrate.

8. The method of claim 1, further comprising bonding the pixel arrangements to contacts or traces of the display substrate.

9. The method of claim 1, wherein separating the first fabrication substrate from the first LED dies comprises applying a laser passing through the first fabrication substrate to detach a semiconductor layer of each first LED die from the first fabrication substrate.

10. The method of claim 1, further comprising applying a laser at an interface of the first fabrication substrate and the first LED dies to detach the first LED dies from the first fabrication substrate.

11. A non-transitory computer-readable storage medium storing instructions thereon, the instructions when executed by a processor cause the processor to:
   transfer first LED dies from a first fabrication substrate onto a first hard handle comprising a first adhesive, each of the first LED dies configured to emit a first colored light, the first LED dies secured onto the first hard handle by the first adhesive;
   transfer one or more of the first LED dies from the first hard handle to a carrier substrate comprising a second adhesive using a pick and place head (PPH) array with electrical contacts of the one or more first LED dies extending in one direction away from epitaxial structures of the first LED dies and facing the carrier substrate to form pixel arrangements on the carrier substrate, each of the pixel arrangements comprising a plurality of LED dies including one of the first LED dies; and transfer one or more pixel arrangements from the carrier substrate to corresponding pixel locations on a display substrate, wherein an adhesive force applied onto a first LED die by the first adhesive in an adhesive state is stronger than an adhesive force applied onto the first LED die by the second adhesive in an adhesive state.

12. The non-transitory computer-readable storage medium of claim 11, wherein the instructions are configured to cause the processor to further:

switch the first adhesive to a non-adhesive state from the adhesive state to release the first LED dies for picking up by the PPH array before transferring the one or more first LED dies from the first hard handle to the carrier substrate.

13. The non-transitory computer-readable storage medium of claim 11, wherein the instructions are configured to cause the processor to further:

switch the second adhesive to a non-adhesive state from the adhesive state to release the pixel arrangements before transferring the first LED dies from the carrier substrate to the display substrate.

14. The non-transitory computer-readable storage medium of claim 11, wherein the carrier substrate comprises a testing circuit configured to perform testing of the one or more first LED dies on the carrier substrate and wherein the instructions are configured to cause the processor to further:

perform testing on the one or more first LEDs on the carrier substrate using the testing circuit to detect defective LEDs; and leave the detected defective LED dies on the carrier substrate.

15. The non-transitory computer-readable storage medium of claim 11, wherein the instructions are configured to cause the processor to further:

transfer one or more second LED dies configured to emit a second colored light from a second hard handle to the carrier substrate, wherein the one or more second LED dies in conjunction with the one or more first LED dies form the pixel arrangements on the carrier substrate.

16. The non-transitory computer-readable storage medium of claim 15, wherein relative positions of the first LED dies and the second LED dies on the carrier substrate are same as relative positions of the first LED dies and the second LED dies on the di splay substrate.

17. A display device, comprising:

a display substrate; and a plurality of LED dies placed on the display substrate, by:

transferring first LED dies from a first fabrication substrate onto a first hard handle comprising a first adhesive, each of the first LED dies configured to emit a first colored light, the first LED dies secured onto the first hard handle by the first adhesive;

transferring one or more of the first LED dies from the first hard handle to a carrier substrate comprising a second adhesive using a pick and place head (PPH) array with electrical contacts of the one or more of the first LED dies extending in one direction away from epitaxial structure of the first LED dies and facing the carrier substrate to form pixel arrangements on the carrier substrate, each of the pixel arrangements comprising a plurality of LED dies including one of the first LED dies; and transferring one or more pixel arrangements from the carrier substrate to corresponding pixel locations on a display substrate, wherein an adhesive force applied onto a first LED die by the first adhesive in an adhesive state is stronger than an adhesive force applied onto the first LED die by the second adhesive in an adhesive state.

* * * * *

UNITED STATES PATENT AND TRADEMARK OFFICE
CERTIFICATE OF CORRECTION

PATENT NO. : 10,984,708 B1
APPLICATION NO. : 16/372324
DATED : April 20, 2021
INVENTOR(S) : Allan Pourchet et al.

Page 1 of 1

It is certified that error appears in the above-identified patent and that said Letters Patent is hereby corrected as shown below:

In the Claims

In Column 12, Claim 16, Line 10, delete "di splay" and insert -- display --, therefor.

Signed and Sealed this
Ninth Day of November, 2021

Drew Hirshfeld
*Performing the Functions and Duties of the
Under Secretary of Commerce for Intellectual Property and
Director of the United States Patent and Trademark Office*